United States Patent [19]

Raynor et al.

[11] Patent Number: 4,790,373
[45] Date of Patent: Dec. 13, 1988

[54] COOLING SYSTEM FOR ELECTRICAL COMPONENTS

[75] Inventors: Vester R. Raynor; Dick L. Knox, both of Claremore, Okla.

[73] Assignee: Hughes Tool Company, Houston, Tex.

[21] Appl. No.: 97,349

[22] Filed: Sep. 8, 1987

Related U.S. Application Data

[63] Continuation of Ser. No. 893,117, Aug. 1, 1986, abandoned.

[51] Int. Cl.4 .............................................. F28F 7/00
[52] U.S. Cl. .................................. 165/185; 165/122; 361/384
[58] Field of Search ................... 165/122, 80.3, 185; 361/384, 383

[56] References Cited

U.S. PATENT DOCUMENTS

| | | | |
|---|---|---|---|
| 3,163,207 | 12/1964 | Schultz | 165/185 X |
| 3,216,496 | 11/1965 | Katz | 165/122 |
| 3,236,296 | 2/1966 | Dubin | 165/122 |
| 3,305,704 | 2/1967 | Battista | 165/80.3 |
| 3,416,597 | 12/1968 | Kupferberg | 165/80.3 |
| 3,435,891 | 4/1969 | Parrish | 165/122 |
| 3,592,260 | 7/1971 | Berger | 165/80.3 |
| 4,027,206 | 5/1977 | Lee | 361/384 X |
| 4,122,508 | 10/1978 | Rumbaugh | 165/80.3 X |
| 4,237,521 | 12/1980 | Denker | 165/122 X |
| 4,352,008 | 9/1982 | Höfer et al. | 165/80.3 X |
| 4,356,864 | 11/1982 | Ariga et al. | 165/80.3 |
| 4,459,638 | 7/1904 | Brehn et al. | 165/80.3 X |
| 4,513,812 | 4/1985 | Papst et al. | 165/121 X |
| 4,525,769 | 6/1985 | Lehmann | 165/122 |

FOREIGN PATENT DOCUMENTS 2231597 1/1973 Fed. Rep. of Germany ...... 165/122

OTHER PUBLICATIONS

IBM Technical Disclosure Bulletin, "High Performance Air-Cooled Module", vol. 28, No. 7, Dec. 1905.

*Primary Examiner*—Michael Koczo
*Assistant Examiner*—P. Neils
*Attorney, Agent, or Firm*—James E. Bradley

[57] ABSTRACT

A cooling system for electrical components that includes a metal heat sink with parallel fins. An axial discharge fan is mounted across from the heat sink fins for discharging air against the fins. The fan has an axis that is perpendicular to the plane containing the fins so that the air strikes the fins at right angles.

1 Claim, 2 Drawing Sheets

COOLING SYSTEM FOR ELECTRICAL COMPONENTS

This application is a continuation of application Ser. No. 893,117 filed Aug. 1, 1986 now abandoned.

BACKGROUND OF THE INVENTION

1. Field of the Invention

This invention relates in general to the cooling of electrical components, and in particular to the use of a heat sink with fins and an electrical fan for discharging air against the fins.

2. Description of the Prior Art

Many electrical devices require means to dissipate heat. The use of heat sinks is common. A typical heat sink is a metal block to which the electrical components that generate heat are mounted. Some of the heat sinks also have fins which assist in dissipating the heat. Some devices use fans which direct air longitudinally through the fins to assist in the heat dissipation.

SUMMARY OF THE INVENTION

The cooling system of this invention includes a metal heat sink to which the electrical components are adapted to be mounted. The heat sink has a plurality of fins. An axial discharge fan is mounted across from the heat sink fins for discharging a stream of air against the fins. The fan is mounted with its axis substantially perpendicular to the fins to cause the air to strike the fins at right angles. The air flow splits and flows in opposite directions toward the ends of the fins.

DESCRIPTION OF THE PREFERRED EMBODIMENT

Figure 1:
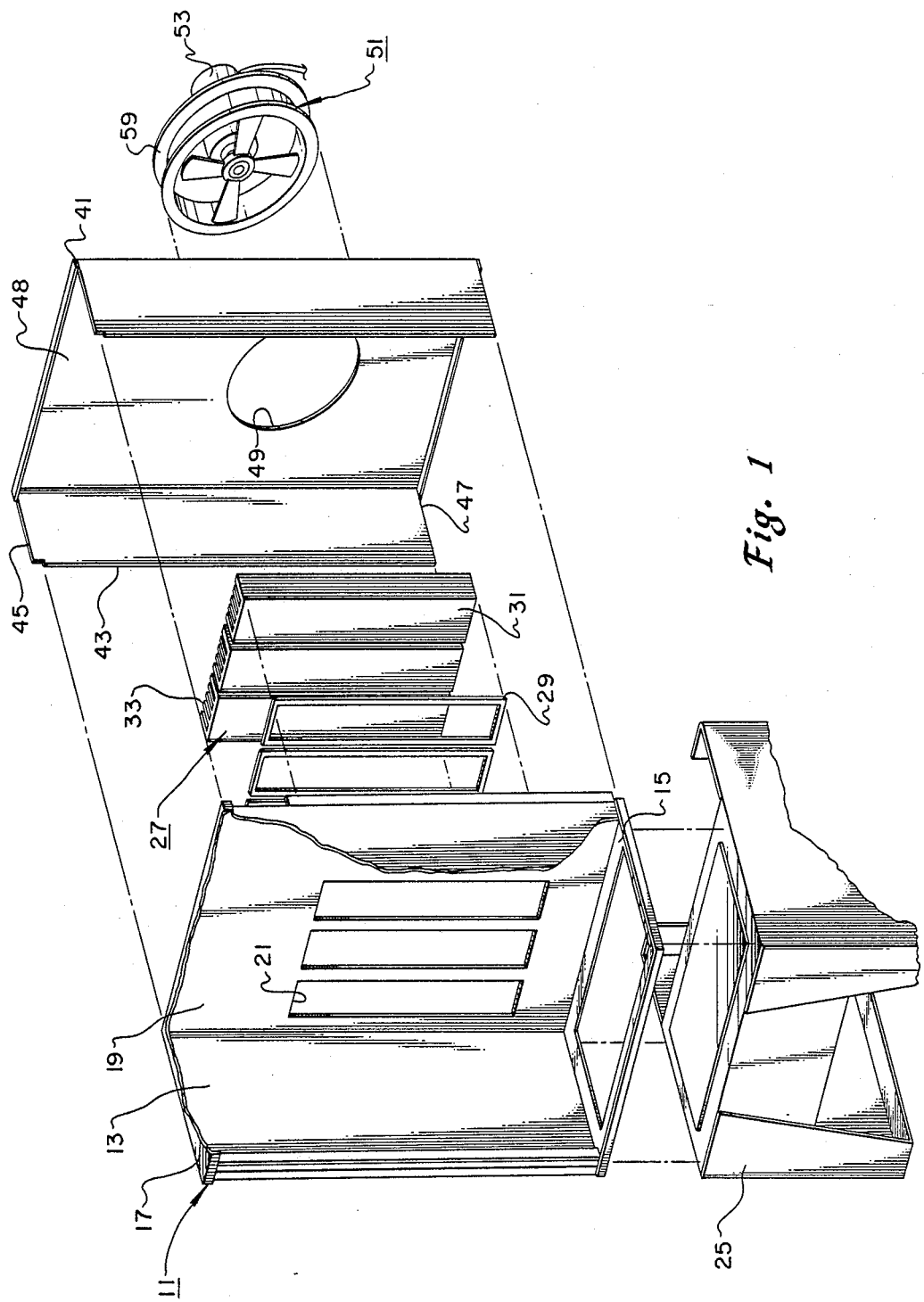
FIG. 1 is a simplified, exploded, persepctive view illustrating a cooling system constructed in accordance with this invention.

Referring to FIG. 1, a housing 11 is shown that is constructed to house the components for an electrical variable speed drive system. The variable speed drive system is of a type that receives AC power, converts it to DC, then converts the DC back to AC at variable frequencies to vary the speed of an electrical motor. The housing 11 is a sheet metal structure having sidewalls 13, a bottom 15 that is closed when assembled, and a closed top 17. Housing 11 also has a back wall 19. Back wall 19 contains a plurality of rectangular apertures 21. A hinged door 23, shown in FIG. 2, serves as the front wall and provides access to the electrical components (not shown). Housing 11 is mounted on a stand 25.

Figure 2:
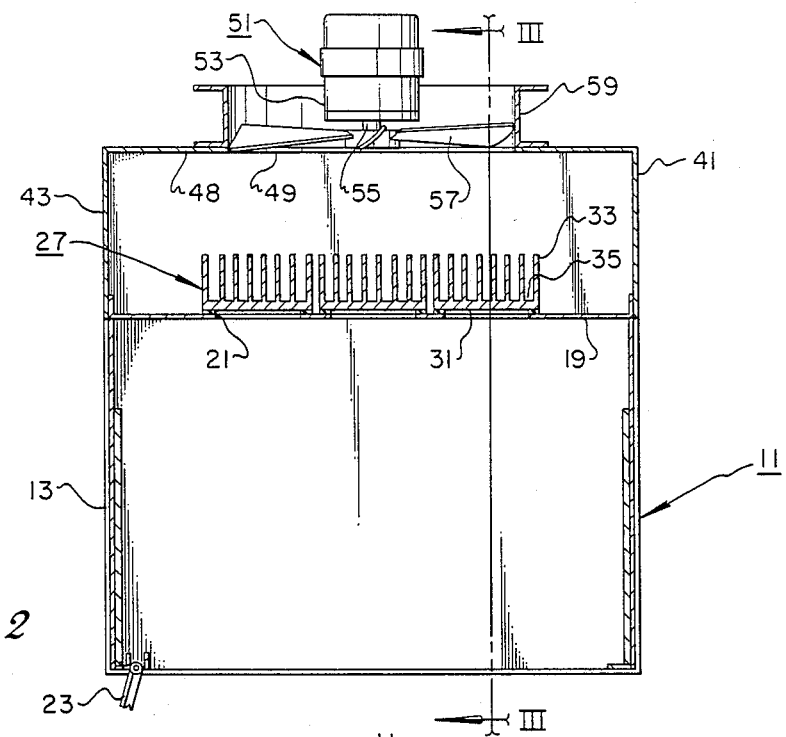
FIG. 2 is a horizontal sectional view of the cooling system of FIG. 1.
Figure 3:
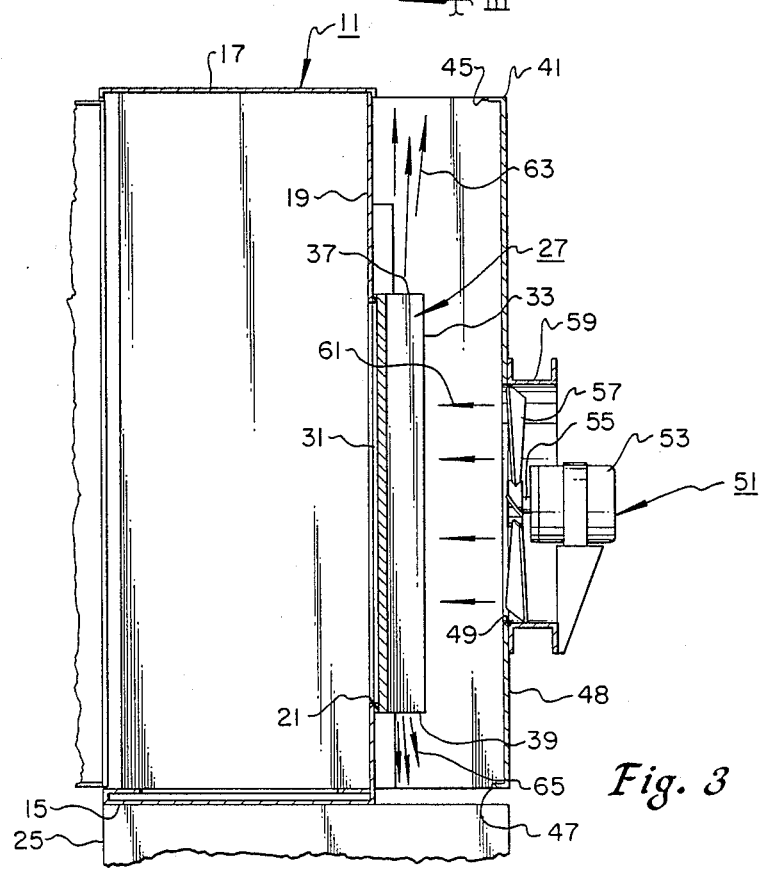
FIG. 3 is a vertical sectional view of the cooling system of FIG. 1, taken along the line III—III of FIG. 3.

Three aluminum heat sinks 27 are mounted to the rear side of the back wall 19. Each heat sink 27 is sealed to the back wall 19 by a gasket 29, and secured by screws or bolts (not shown). Each heat sink 27 is rectangular and only slightly greater in dimension than one of the apertures 21. Each heat sink 27 has a front 31 that is exposed to the interior of the housing 11 through the aperture 21. The front 31 is adapted to receive electrical components (not shown) which are screwed or otherwise affixed to the heat sink 27. Each heat sink 27 has a plurality of vertical fins 33 extending from the top to the bottom. As shown in FIGS. 2 and 3, the fins 33 are straight, parallel, and perpendicular to the back wall 19 of the housing 11. The spaces between the fins 33 define longitudinal channels 35 that extend the full length of the heat sink 27. Channels 35 are open at the top 37 and bottom 39.

Referring again to FIG. 1, a shroud 41 is mounted to the back wall 19 of housing 11. Shroud 41 is rectangular, having two parallel sidewalls 43, each of which is located substantially in the same plane as the housing sidewalls 13. Each sidewall 43 is perpendicular to the back wall 19 of the housing 11. The shroud 41 has an open top 45 and an open bottom 47. Shroud 41 has a back wall 48 that is parallel with the back wall 19 of the housing 11. Back wall 48 has a hole 49 located therein substantially in the center of the back wall 48.

A fan 51 is adapted to be mounted to the rear side of the back wall 48 of the shroud 41. Fan 51 is a propeller type axial flow fan for discharging air through hole 49. As shown in FIG. 3, it has a motor 53 which rotates a shaft 55 on the axis of the fan 51. A plurality of blades 57 are mounted to the shaft 55. A circular shroud 59 extends around the blades 57. Air is drawn in from the exterior and discharged straight toward the back wall 19 as shown by the arrow 61.

The axis of shaft 55 is perpendicular to the back wall 19 and thus to the channels 35 of the fins 33. The axis of shaft 55 intersects the central heat sink 27 at substantially the horizontal and vertical center of the central heat sink 27. This causes the air to strike the fins 33 at right angles, as shown by the arrow 61. The central point and the right angle of intersection causes the air flow to split, with some of it flowing upwardly in the channels 35 as indicated by arrow 63 to flow out the open top 45. Another portion of the air flows down the channels 35 to discharge out the bottom 47, as indicated by the arrow 65.

In operation, the electrical components (not shown) will generate heat. The heat will flow into the heat sinks 27 for dissipation through the fins 33. The fan 51 rotates, causing air to strike the fins 33 at right angles as shown by arrow 61. The air flow splits with some of it flowing upwardly as indicated by arrow 63, and some of it flowing downwardly as indicated by arrow 65. The air flow aids in dissipating the heat from the heat sinks 27 and thus maintains the electrical components at safe temperatures.

In one embodiment, the shroud 41 is about 60 inches tall, and the heat sinks 27 each are about 28 inches high. Each heat sink 27 has eight fins 33 and is 5.25 inches wide. Each heat sink 27 has a base thickness of about ½ inches, and the fins 33 are about 2.5 inches in depth. The fin 33 thickness is preferably about 0.15 inch. The shroud 41 sidewall 43 is preferably about 9 inches wide. This places the fan blades 57 about six inches away from the fins 33. The fan 51 is preferably about 14 inches in diameter and delivers about 1200 cubic feet per minute of air.

The invention has significant advantages. Locating the propeller type axial flow fan perpendicular to the fins results in moving larger quantities of air with a lesser pressure drop then mounting a fan for parallel flow across the fins. The location of the fan also provides easier access to the heat sinks for cleaning than if the fan is mounted on one end of the heat sinks for parallel flow.

While the invention has been described in only one of its forms, it should be apparent to those skilled in the art, that it is not so limited, but is susceptible to various changes without departing from the scope of the invention.

We claim:

1. In an electrical apparatus of the type having a housing containing a plurality of electrical components, an improved cooling system for cooling the electrical components, comprising in combination:

a back wall in the housing having an aperture;

a metal heat sink mounted outside the housing to the back wall flush against the aperture, having a front surface exposed to the interior of the housing through the aperture to which electrical components are adapted to be mounted, the heat sink having a back surface containing a plurality of parallel, vertical fins, defining channels therebetween with open tops and bottoms;

a shroud mounted to the rear of the housing, having a back wall parallel with the back wall of the housing and spaced rearwardly from it, the back wall of the shroud having a hole therein, the shroud having an open top and an open bottom; and fan means mounted to the back wall of the shroud over the hole, for discharging air into the channels against the back surface of the heat sink at substantially a right angle to the back surface of the heat sink, and for causing the air discharge to split into two flow paths when contacting the back surface and flow through the channels in opposite directions out the top and the bottom of the channels and out the top and bottom of the shroud.

* * * * *